US008644526B2

(12) United States Patent
Ehara et al.

(10) Patent No.: US 8,644,526 B2

(45) Date of Patent: Feb. 4, 2014

(54) AUDIO SIGNAL DECODING DEVICE AND BALANCE ADJUSTMENT METHOD FOR AUDIO SIGNAL DECODING DEVICE

(75) Inventors: Hiroyuki Ehara, Kanagawa (JP); Takuya Kawashima, Ishikawa (JP); Koji Yoshida, Kanagawa (JP)

(73) Assignee: Panasonic Corporation, Osaka (JP)

( * ) Notice: Subject to any disclaimer, the term of this patent is extended or adjusted under 35 U.S.C. 154(b) by 561 days.

(21) Appl. No.: 12/992,791

(22) PCT Filed: Jun. 26, 2009

(86) PCT No.: PCT/JP2009/002964

§ 371 (c)(1), (2), (4) Date: Nov. 15, 2010

(87) PCT Pub. No.: WO2009/157213

PCT Pub. Date: Dec. 30, 2009

(65) Prior Publication Data

US 2011/0064229 A1 Mar. 17, 2011

(30) Foreign Application Priority Data

Jun. 27, 2008 (JP) ................................ 2008-168180
Nov. 19, 2008 (JP) ................................ 2008-295814

(51) Int. Cl.
*H03G 3/00* (2006.01)

(52) U.S. Cl.
USPC ............................................ 381/104; 381/22

(58) Field of Classification Search
USPC .......... 381/1-4, 17-23, 103-107, 56; 700/94; 704/233, 500, 501, 200.1; 369/4, 5
See application file for complete search history.

(56) References Cited

U.S. PATENT DOCUMENTS 5,633,880 A 5/1997 Lokhoff
8,014,534 B2 * 9/2011 Henn et al. ...................... 381/23
2005/0182996 A1 8/2005 Bruhn
2006/0147048 A1 * 7/2006 Breebaart et al. ............... 381/23
2007/0242832 A1 10/2007 Matsumoto et al.
2008/0086312 A1 4/2008 Kakuno et al.

FOREIGN PATENT DOCUMENTS

JP 5-83206 4/1993
JP 2001-296894 10/2001

(Continued)

OTHER PUBLICATIONS

"Radio Broadcasting Systems: Digital Audio Broadcasting (DAB) to mobile, portable and fixed receivers", European Broadcasting Union, Final Draft ETSI EN 300 401, V1.4.1, XP014032143, Jan. 2006.*

(Continued)

*Primary Examiner* — Lun-See Lao

(74) *Attorney, Agent, or Firm* — Greenblum & Bernstein, P.L.C.

(57) ABSTRACT

Fluctuation in decoded signal localization is suppressed to maintain the feel of stereo. A selection unit selects balance parameters when the balance parameters are input from a gain coefficient decoding unit, or selects balance parameters input from a gain coefficient calculation unit when there is no balance parameter input from the gain coefficient decoding unit, and outputs the selected balance parameters to a multiplication unit. The multiplication unit multiplies a gain coefficient input from the selection unit with a decoded monaural signal input from a monaural decoding unit to perform balance adjustment processing.

6 Claims, 12 Drawing Sheets

(56) References Cited

FOREIGN PATENT DOCUMENTS

| | | |
|---|---|---|
| JP | 2004-535145 | 11/2004 |
| JP | 2005-202052 | 7/2005 |
| JP | 2005-533271 | 11/2005 |
| JP | 2007-529020 | 10/2007 |
| JP | 2008-96508 | 4/2008 |
| WO | 03/007656 | 1/2003 |
| WO | 2004/008806 | 1/2004 |
| WO | 2009/038512 | 3/2009 |

OTHER PUBLICATIONS

Ville Pulkki et al., "Localization of Amplitude-Panned Virtual Sources I: Stereophonic Panning*", Papers, J. Audio Engineering Society, vol. 49, No. 9 , Sep. 2001, pp. 739-752.

B. Cheng et al., "Principles and Analysis of the Squeezing Approach to Low Bit Rate Spatial Audio Coding", Faculty of Informatics Faculty of Informatics—Papers, University of Wollongon, 2007, pp. I-13-I-16.

Extended European Search Report, dated Aug. 21, 2012, from European Patent Office (EPO) for corresponding European patent application.

* cited by examiner

AUDIO SIGNAL DECODING DEVICE AND BALANCE ADJUSTMENT METHOD FOR AUDIO SIGNAL DECODING DEVICE

TECHNICAL FIELD

The present invention relates to an acoustic signal decoding apparatus and a balance adjusting method in the acoustic signal decoding apparatus.

BACKGROUND ART

As a scheme of encoding stereo acoustic signals at a low bit rate, an intensity stereo scheme is known. The intensity stereo scheme adopts a method of generating the L channel signal (left channel signal) and the R channel signal (right channel signal) by multiplying a monaural signal by a scaling factor. This method is also called "amplitude panning."

The most basic method of amplitude panning is to find the L channel signal and the R channel signal by multiplying a time-domain monaural signal by a gain factor for amplitude panning (i.e. panning gain factor) (e.g. see Non-Patent Literature 1). Also, there is another method of finding the L channel signal and the R channel signal by multiplying a monaural signal by a panning gain factor every frequency component (or every frequency group) in the frequency domain (e.g. see Non-Patent Literature 2 and Patent Literature 3).

If panning gain factors are used as parametric stereo coding parameters, it is possible to realize stereo signal scalable coding (monaural-to-stereo scalable coding) (e.g. see Patent Literature 1 and Patent Literature 2). Panning gain factors are explained as balance parameters in Patent Literature 1 and as ILD (level difference) in Patent Literature 2.

Also, monaural-to-stereo scalable coding using panning for monaural-to-stereo prediction and encoding the difference between a stereo signal and an input stereo signal obtained by panning, has been proposed (e.g. Patent Literature 3).

CITATION LIST

Patent Literature

[PTL 1]
Japanese Translation of PCT Application Laid-Open No. 2004-535145
[PTL 2]
Japanese Translation of PCT Application Laid-Open No. 2005-533271
[PTL 3]
International Publication No. 2009/038512

Non-Patent Literature

[NPL 1]
V. Pulkki and M. Karjalainen, "Localization of amplitude-panned virtual sources I: Stereophonic panning", Journal of the Audio Engineering Society, Vol. 49, No. 9, September, 2001, pp. 739-752
[NPL 2]
B. Cheng, C. Ritz and I. Burnett, "Principles and analysis of the squeezing approach to low bit rate spatial audio coding", proc. IEEE ICASSP2007, pp. I-13-1-16, April, 2007

SUMMARY OF INVENTION

Technical Problem

However, in monaural-to-stereo scalable coding, a case is possible where stereo encoded data is lost on a transmission path and is not received on the decoding apparatus side. Also, a case is possible where error occurs in stereo encoded data on a transmission path and the stereo encoded data is discarded on the decoding apparatus side. In this case, the decoding apparatus cannot use balance parameters (panning gain factors) included in stereo encoded data, and, consequently, stereo and monaural are switched, which varies the localization of decoded acoustic signals. As a result, the quality of stereo acoustic signals degrades.

It is therefore an object of the present invention to provide an acoustic signal decoding apparatus that can alleviate the fluctuation of localization of decoded signals and maintain the stereo performance, and a balance adjusting (amplitude panning) method in the acoustic signal decoding apparatus.

Solution to Problem

The acoustic signal decoding apparatus of the present invention employs a configuration having: a decoding section that decodes a first balance parameter from stereo encoded data; a calculating section that calculates a second balance parameter using a first channel signal and a second channel signal of a stereo signal obtained in a past; and a balance adjusting section that performs balance adjustment processing of a monaural signal using the second balance parameter as a balance adjustment parameter when the first balance parameter cannot be used.

The balance adjusting method of the present invention includes: a decoding step of decoding a first balance parameter from stereo encoded data; a calculating step of calculating a second balance parameter using a first channel signal and a second channel signal of a stereo signal obtained in a past; and a balance adjusting step of performing balance adjustment processing of a monaural signal using the second balance parameter as a balance adjustment parameter when the first balance parameter cannot be used.

Advantageous Effects of Invention

According to the present invention, it is possible to alleviate the fluctuation of localization of decoded signals and maintain the stereo performance.

DESCRIPTION OF EMBODIMENT

Now, embodiments of the present invention will be explained with reference the accompanying drawings. Also, balance adjustment processing in the present invention refers to processing of converting a stereo signal by multiplying a monaural signal by balance parameters, and is equivalent to amplitude panning processing. Also, with the present invention, balance parameters are defined as gain factors by which a monaural signal is multiplied upon converting the monaural signal into a stereo signal, and are equivalent to panning gain factors in amplitude panning.

(Embodiment 1)

Figure 1:
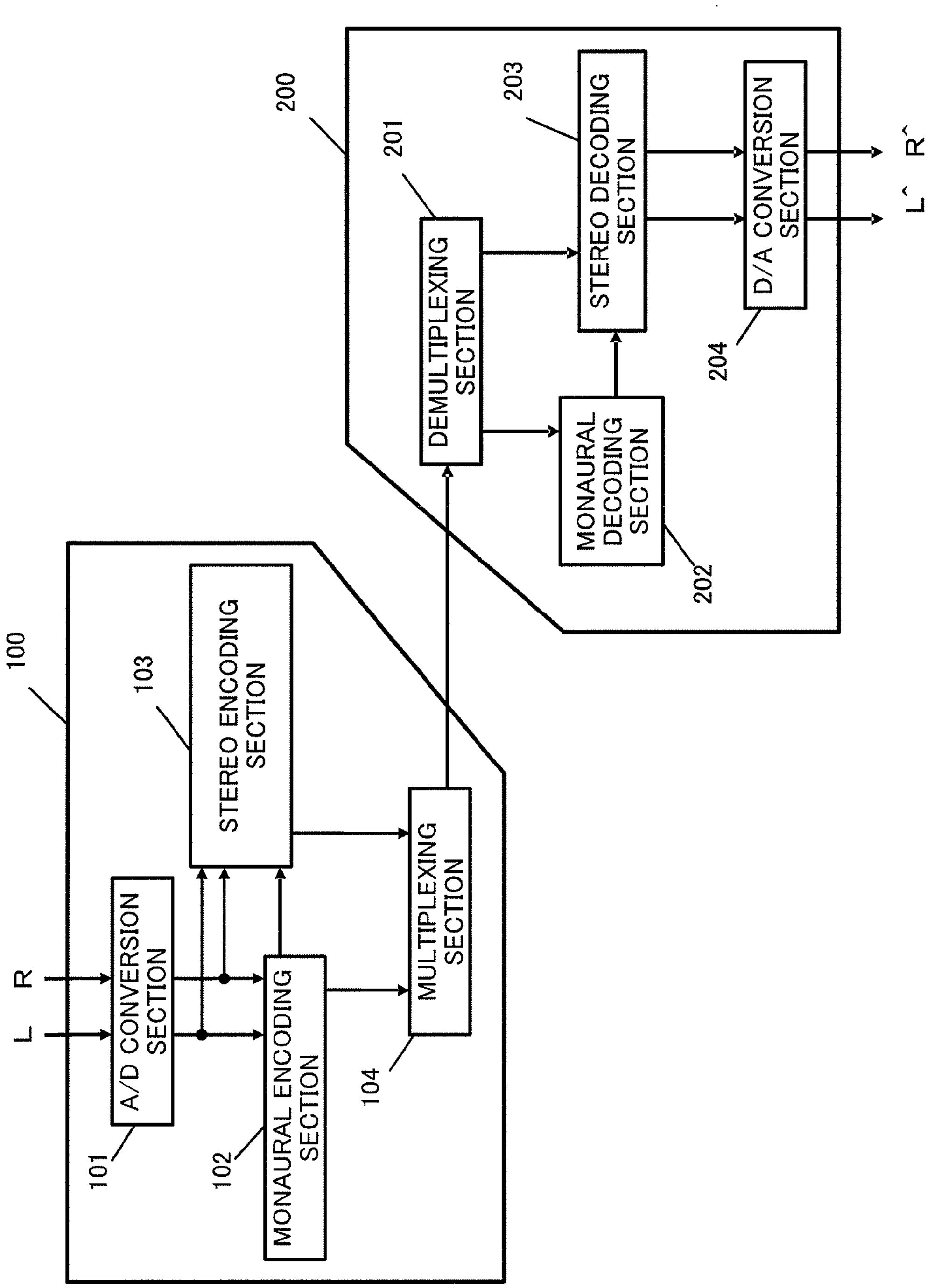
FIG. 1 is a block diagram showing configurations of an acoustic signal encoding apparatus and acoustic signal decoding apparatus according to Embodiment 1 of the present invention.

FIG. 1 shows the configurations of acoustic signal encoding apparatus 100 and acoustic signal decoding apparatus 200 according to Embodiment 1.

As shown in FIG. 1, acoustic signal encoding apparatus 100 is provided with A/D conversion section 101, monaural encoding section 102, stereo encoding section 103 and multiplexing section 104.

A/D conversion section 101 receives as input an analog stereo signal (L channel signal: L, R channel signal: R), converts this analog stereo signal into a digital stereo signal and outputs this signal to monaural encoding section 102 and stereo encoding section 103.

Monaural encoding section 102 performs down-mix processing of the digital stereo signal to convert it into a monaural signal, encodes this monaural signal and outputs the coding result (monaural encoded data) to multiplexing section 104. Also, monaural encoding section 102 outputs information obtained by coding processing (i.e. monaural coding information) to stereo encoding section 103.

Stereo encoding section 103 parametrically encodes the digital stereo signal using the monaural coding information and outputs the coding result including balance parameters (i.e. stereo encoded data) to multiplexing section 104.

Multiplexing section 104 multiplexes the monaural encoded data and the stereo encoded data and outputs the multiplexing result (multiplexed data) to demultiplexing section 201 of acoustic signal decoding apparatus 200.

Here, there is a transmission path (not shown) such as a telephone line and a packet network between multiplexing section 104 and demultiplexing section 201, and the multiplexed data outputted from multiplexing section 104 is subjected to processing such as packetization if necessary and then outputted to the transmission path.

In contrast, acoustic signal decoding apparatus 200 is provided with demultiplexing section 201, monaural decoding section 202, stereo decoding section 203 and D/A conversion section 204.

Demultiplexing section 201 receives and demultiplexes multiplexed data transmitted from acoustic signal encoding apparatus 100 into monaural encoded data and stereo encoded data, and outputs the monaural encoded data to monaural decoding section 202 and the stereo encoded data to stereo decoding section 203.

Monaural decoding section 202 decodes the monaural encoded data into a monaural signal and outputs this decoded monaural signal to stereo decoding section 203. Further, monaural decoding section 202 outputs information (i.e. monaural decoding information) obtained by this decoding processing to stereo decoding section 203.

Here, monaural decoding section 202 may output the decoded monaural signal to stereo decoding section 203 as a stereo signal subjected to up-mix processing. If up-mix processing is not performed in monaural decoding section 202, information required for up-mix processing may be outputted from monaural decoding section 202 to stereo decoding section 203 and up-mix processing may be performed on the decoded monaural signal in stereo decoding section 203.

Here, generally, up-mix processing does not require special information. However, if down-mix processing of matching the phase between the L channel and the R channel is performed, phase difference information is considered as information required for up-mix processing. Also, if down-mix processing of matching amplitude levels between the L channel and the R channel, scaling factors to match the amplitude levels are considered as information required for up-mix processing.

Stereo decoding section 203 decodes the decoded monaural signal into a stereo signal using the stereo encoded data and the monaural decoding information, and outputs the digital stereo signal to D/A conversion section 204.

D/A conversion section 204 converts the digital stereo signal into an analog stereo signal and outputs the analog stereo signal as a decoded stereo signal (decoded L channel signal: L^ signal, decoded R channel signal: R^ signal).

Figure 2:
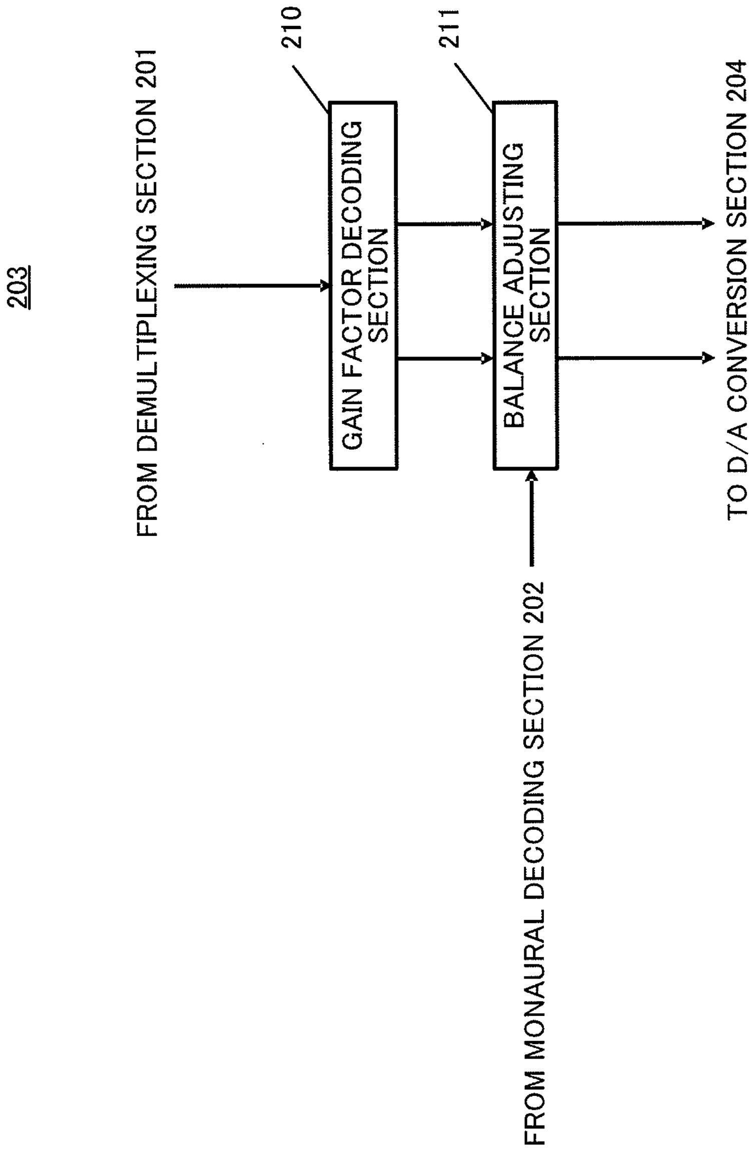
FIG. 2 is a block diagram showing a configuration example of a stereo decoding section according to Embodiment 1 of the present invention.

Next, FIG. 2 shows a configuration example of stereo decoding section 203 of acoustic signal decoding apparatus 200. As an example, a configuration will be explained in which a stereo signal is parametrically expressed by balance adjustment processing.

As shown in FIG. 2, stereo decoding section 203 includes gain factor decoding section 210 and balance adjusting section 211.

Gain factor decoding section 210 decodes balance parameters from stereo encoded data received as input from demultiplexing section 201, and outputs these balance parameters to balance adjusting section 211. FIG. 2 shows an example where a balance parameter for the L channel and a balance parameter for the R channel are each outputted from gain factor decoding section 210.

Balance adjusting section 211 performs balance adjustment processing of a monaural signal using these balance parameters. That is, balance adjusting section 211 multiplies a decoded monaural signal received as input from monaural decoding section 202 by these balance parameters to generate the decoded L channel signal and the decoded R channel signal. Here, assume that the decoded monaural signal refers to a frequency domain signal (for example, FFT (Fast Fourier Transform) factors and MDCT (Modified Discrete Cosine Transform) factors). Therefore, the decoded monaural signal is multiplied by these balance parameters every frequency.

A normal acoustic signal decoding apparatus performs processing of a decoded monaural signal on a per subband basis, where the width of each subband is normally set wider in higher frequency. Even in the present embodiment, one balance parameter is decoded in one subband, and the same balance parameter is used for the frequency components in each subband. Also, it is equally possible to use a decoded monaural signal as a time domain signal.

Figure 3:
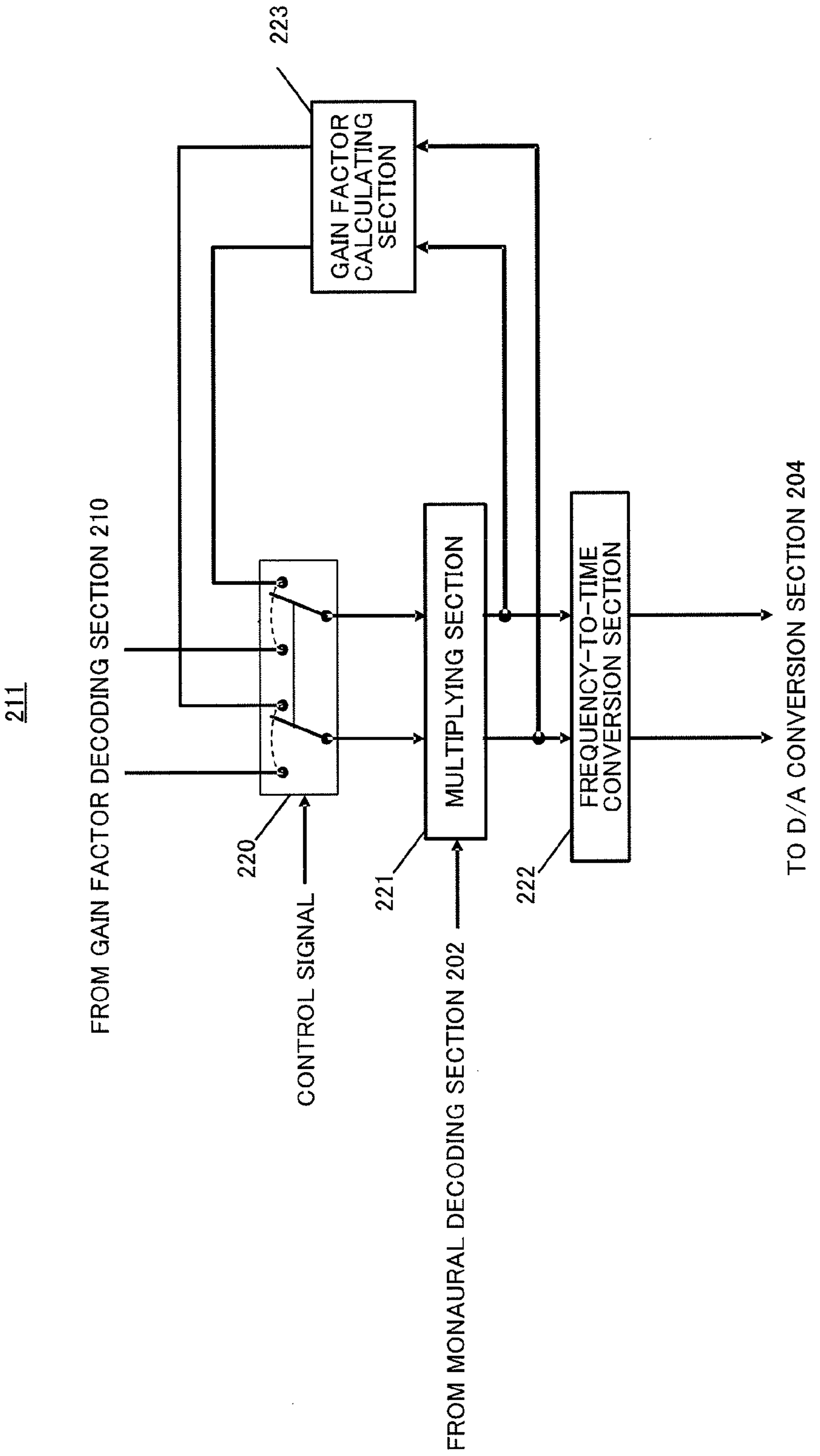
FIG. 3 is a block diagram showing a configuration example of a balance adjusting section according to Embodiment 1 of the present invention.

Next, FIG. 3 shows a configuration example of balance adjusting section 211.

As shown in FIG. 3, balance adjusting section 211 includes selecting section 220, multiplying section 221, frequency-to-time conversion section 222 and gain factor calculating section 223.

Balance parameters received as input from gain factor decoding section 210 are received as input in multiplying section 221 via selecting section 220.

In the case of receiving balance parameters as input from gain factor decoding section 210 (i.e. in the case where balance parameters included in stereo encoded data can be used), selecting section 220 selects these balance parameters, or, in the case of not receiving balance parameters as input from gain factor decoding section 210 (i.e. in the case where balance parameters included in stereo encoded data cannot be used), selecting section 220 selects balance parameters received as input from gain factor calculating section 223, and outputs the selected balance parameters to multiplying section 221. Selecting 220 is formed with two switching switches as shown in FIG. 3, for example. One switching switch is for the L channel and the other switching switch is for the R channel, and the above selection is performed by switching these switching switches together.

Here, as a case where balance parameters are not received as input from gain factor decoding section 210 to selecting section 220, a case is possible where stereo encoded data is lost on the transmission path and is not received in acoustic signal decoding apparatus 200, or where error is detected in stereo encoded data received in acoustic signal decoding apparatus 200 and this data is discarded. That is, a case where balance parameters are not received as input from gain factor decoding section 210 is equivalent to a case where balance parameters included in stereo encoded data cannot be used. Therefore, a control signal indicating whether or not balance parameters included in stereo encoded data can be used, is received as input in selecting section 220, and the connection state of the switching switches in selecting section 220 is changed based on this control signal.

Also, for example, in order to reduce the bit rate, if balance parameters included in stereo encoded data are not used, selecting section 220 may select balance parameters received as input from gain factor calculating section 223.

Multiplying section 221 multiplies the decoded monaural signal (which is a monaural signal as a frequency domain parameter) received as input from monaural decoding section 202 by the balance parameter for the L channel and the balance parameter for the R channel received as input from selecting section 220, and outputs multiplication results for these L and R channels (which are a stereo signal as a frequency domain parameter) to frequency-to-time conversion section 222 and gain factor calculating section 223. That is, multiplying section 221 performs balance adjustment processing of the monaural signal.

Frequency-to-time conversion section 222 converts the multiplication results for the L and R channels in multiplying section 221 into time domain signals and outputs these signals to D/A conversion section 204 as digital stereo signals for the L and R channels.

Gain factor calculating section 223 calculates respective balance parameters for the L and R channels from the multiplication results for the L and R channels in multiplying section 221, and outputs these balance parameters to selecting section 220.

An example of a specific method of calculating balance parameters in gain factor calculating section 223 will be explained below.

In the i-th frequency component, assume that: a balance parameter for the L channel is GL[i]; a balance parameter for the R channel is GR[i]; a decoded stereo signal for the L channel is L[i]; and a decoded stereo signal for the R channel is R[i]. Gain factor calculating section 223 calculates GL[i] and GR[i] according to equations 1 and 2.

$$GL[i]=|L[i]|/(|L[i]|+|R[i]|) \quad \text{(Equation 1)}$$

$$GR[i]=|R[i]|/(|L[i]|+|R[i]|) \quad \text{(Equation 2)}$$

Here, absolute values may not be calculated in equations 1 and 2. Also, in the calculation of the denominator, after adding L and R, the absolute values may be calculated. However, in the case of adding L and R and then calculating the absolute values, if L an R have opposite signs, balance parameters may become large significantly. Therefore, in this case, a countermeasure is necessary to, for example, set a threshold for the magnitude of balance parameters and clip the balance parameters.

Also, in a case of decoding the results of quantizing the differences between output signals of multiplying section 221 and L and R channel signals, it is preferable to calculate gain factors according to equations 1 and 2, using the L channel signal and the R channel signal after adding the decoded, quantized differences. By this means, it is possible to calculate suitable balance parameters even if the coding performance by balance adjustment processing alone (i.e. the ability of representing input signals faithfully) is not sufficient. Also, in order to decoded the above quantized differences, balance adjusting section 211 in FIG. 3 employs a configuration inserting a quantized difference decoding section (not shown) between multiplying section 221 and frequency-to-time conversion section 222, in which the quantized difference decoding section decodes the result of quantizing the difference between a decoded L channel signal subjected to balance adjustment processing (i.e. the stereo input L channel signal quantized using balance adjustment) and the L channel signal of the stereo input signal, and decodes the result of quantizing the difference between a decoded R channel signal subjected to balance adjustment processing (i.e. the stereo input R channel signal quantized using balance adjustment) and the R channel signal of the stereo input signal. The quantized difference decoding section receives the decoded stereo signals for the L and R channels as input from multiplying section 221, receives as input from demultiplexing section 201 and decodes quantized difference encoded data, adds the resulting quantized difference decoded signals to the decoded stereo signals for the L and R channels, respectively, and outputs the addition results to time-to-frequency conversion section 222 as the final decoded stereo signals.

Figure 4:
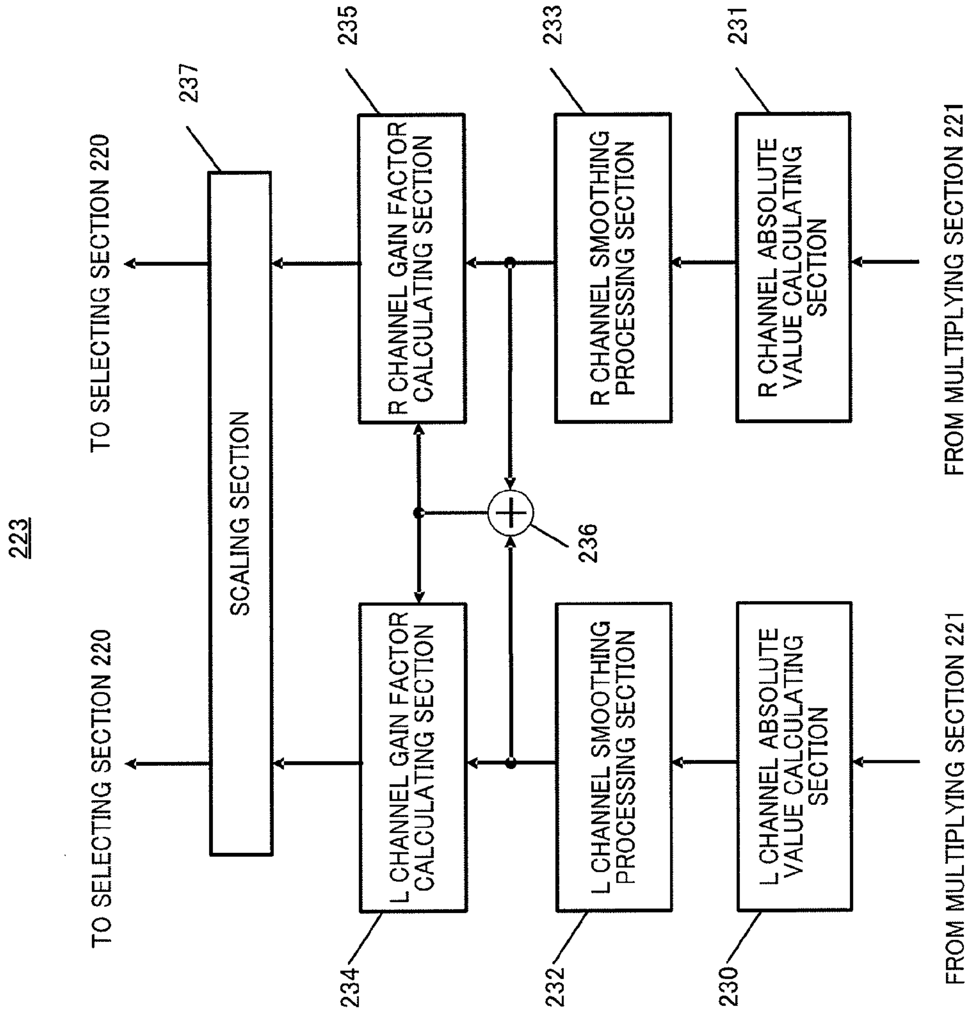
FIG. 4 is a block diagram showing a configuration example of a gain factor calculating section according to Embodiment 1 of the present invention.

Next, FIG. 4 shows a configuration example of gain factor calculating section 223.

As shown in FIG. 4, gain factor calculating section 223 is provided with L channel absolute value calculating section 230, R channel absolute value calculating section 231, L channel smoothing processing section 232, R channel smoothing processing section 233, L channel gain factor calculating section 234, R channel gain factor calculating section 235, adding section 236 and scaling section 237. L channel absolute value calculating section 230 calculates the absolute value of each frequency component of frequency domain parameters of the L channel signal received as input from multiplying section 221, and outputs the results to L channel smoothing processing section 232.

R channel absolute value calculating section 231 calculates the absolute value of each frequency component of frequency domain parameters of the R channel signal received as input from multiplying section 221, and outputs the results to R channel smoothing processing section 233.

L channel smoothing processing section 232 applies smoothing processing on the frequency axis to the absolute value of each frequency component of frequency domain parameters of the L channel signal, and outputs the frequency domain parameters smoothing the L channel signal on the frequency axis, to L channel gain factor calculating section 234 and adding section 236.

Here, smoothing processing on the frequency axis is equivalent to applying low-pass filter processing on the frequency axis to frequency domain parameters.

To be more specific, as shown in equation 3, processing is performed to add one component before or one component after each frequency component and then calculate the average value, that is, calculate the average movement of three points. In equation 3, LF(f) refers to a frequency domain parameter of the L channel signal (a parameter after calculating the absolute value), LFs(f) refers to a frequency domain parameter after smoothing processing of the L channel, and f refers to a frequency number (which is an integer).

$$LFs(f)=(LF(f-1)+LF(f)+LF(f+1))/3 \quad \text{(Equation 3)}$$

Also, as shown in equation 4, it is equally possible to perform smoothing processing on the frequency axis using autoregressive low-pass filter processing. Here, a refers to a smoothing factor.

$$LFs(f)=LF(f)+\alpha\times LFs(f-1)0<\alpha<1 \quad \text{(Equation 4)}$$

R channel smoothing processing section 233 applies smoothing processing on the frequency axis to the absolute value of each frequency component of frequency domain parameters of the L channel signal, and outputs the frequency domain parameters smoothing the L channel signal on the frequency axis, to L channel gain factor calculating section 234 and adding section 236.

As smoothing processing in R channel smoothing processing section 233, similar to the smoothing processing in L channel smoothing processing section 232, processing is performed to add one component before or one component after each frequency component and then calculate the average value, that is, calculate the average movement of three points, as shown in equation 5. In equation 5, RF(f) refers to a frequency domain parameter of the R channel signal (a parameter after calculating the absolute value), and RFs(f) refers to a frequency domain parameter after smoothing processing of the R channel.

$$RFs(f)=(RF(f-1)+RF(f)+RF(f+1))/3 \quad \text{(Equation 5)}$$

Also, as shown in equation 6, it is equally possible to perform smoothing processing on the frequency axis using autoregressive low-pass filter processing.

$$RFs(f)=RF(f)+\alpha\times RFs(f-1)0<\alpha<1 \quad \text{(Equation 6)}$$

Also, L channel smoothing processing and R channel smoothing processing are necessarily the same processing. For example, if signal characteristics of the L channel and signal characteristics of the R channel are different, there may be a case where different smoothing processing is used purposefully.

Adding section 236 adds, on a per frequency component basis, the frequency domain parameters smoothing the L channel signal and the frequency domain parameters smoothing the R channel signal, and outputs the addition results to L channel gain factor calculating section 234 and R channel gain factor calculating section 235.

L channel gain factor calculating section 234 calculates the amplitude ratio between the frequency domain parameter (LFs(f)) smoothing the L channel signal and the addition result (LFs(f)+RFs(f)) received as input from adding section 236, and outputs the amplitude ratio to scaling section 237. That is, L channel gain factor calculating section 234 calculates gl(f) shown in equation 7.

$$gL(f)=LFs(f)/(LFs(f)+RFs(f)) \quad \text{(Equation 7)}$$

R channel gain factor calculating section 235 calculates the amplitude ratio between the frequency domain parameter (RFs(f)) smoothing the R channel signal and the addition result (LFs(f)+RFs(f)) received as input from adding section 236, and outputs the amplitude ratio to scaling section 237. That is, R channel gain factor calculating section 235 calculates gl(f) shown in equation 8.

$$gR(f)=RFs(f)/(LFs(f)+RFs(f)) \quad \text{(Equation 8)}$$

Scaling section 237 performs scaling processing of gL(f) and gR(f) to calculate balance parameter GL(f) for the L channel and balance parameter GR(f) for the R channel, gives one-frame delay to them and then outputs these balance parameters to selecting section 220.

Here, if monaural signal M(f) is defined as, for example, M(f)=0.5(L(f)+R(f)), scaling section 237 performs scaling processing of gL(f) and gR(f) such that GL(f)+GR(f)=2.0. To be more specific, scaling section 237 calculates GL(f) and GR(f) by multiplying gL(f) and gR(f) by 2/(gL(f)+gR(f)).

Also, in a case where GL(f) and GR(f) are calculated in L channel gain factor calculating section 234 and R channel gain factor calculating section 235 so as to satisfy the relationship of GL(f)+GR(f)=2.0, scaling section 237 needs not perform scaling processing. For example, in a case where GR(f) is calculated as GR(f)=2.0−GL(f) after calculating GL(f) in L channel gain factor calculating section 234, scaling section 237 needs not perform scaling processing. Therefore, in this case, it is equally possible to input the outputs of L channel gain factor calculating section 234 and R channel gain factor calculating section 235 in selecting section 220. This configuration will be described later in detail using FIG. 12. Also, although a case has been described here where the L channel gain factor is calculated first, it is equally possible to calculate the R channel gain factor first and then calculate L channel gain factor GL(f) from GL(f)=2.0−GR(f).

Also, in a case where it is not possible to consecutively use balance parameters included in stereo encoded data, a state continues where balance parameters outputted from gain factor calculating section 223 are selected. Even in this case, if the above processing in gain factor calculating section 223 is repeated, by repeating the above smoothing processing, balance parameters calculated in gain factor calculating section 223 are gradually averaged over the whole band, so that it is possible to adjust the level balance between the L channel and the R channel to a suitable level balance.

Also, if a state continues where balance parameters outputted from gain factor calculating section 223 are selected, it may be possible to perform processing of making balance parameters closer gradually from balance parameters calculated first to 1.0 (i.e. closer to monaural). For example, the processing shown in equation 9 may be performed. In this case, in other frames than the frame in which balance parameters cannot be used at first, the above smoothing processing is not necessary. Therefore, by using this processing, it is possible to reduce the amount of calculations related to gain factor calculation, compared to a case where the above smoothing processing is performed. Also, β is a smoothing factor.

$$GL(f)=\beta GL(f)+(1-\beta)0<\beta<1 \quad \text{(Equation 9)}$$

Also, after a state continues where balance parameters outputted from gain factor calculating section 223 are selected, if the state is changed to a state where balance parameters outputted from gain factor decoding section 210 are selected, a phenomenon occurs that sound image or localization changes rapidly. By this rapid change, subjective quality may degrade. Therefore, in this case, it may be possible to use, as a balance parameter received as input in multiplying section 221, an intermediate value between a balance parameter outputted from gain factor decoding section 210 and a balance parameter outputted from gain factor calculating section 223 immediately before the selection state changes. For example, a balance parameter received as input in multiplying section 221 may be calculated according to equation 10. Here, the balance parameter received as input from gain factor decoding section 210 is G^, the balance parameter finally outputted from gain factor calculating section 223 is Gp, and the balance parameter received as input in multiplying section 221 is Gm. Also, γ is an internal division factor, and β is a smoothing factor for smoothing γ.

$$Gm=\gamma Gp+(1-\gamma)G\hat{},\gamma=\beta\gamma,0<\beta<1 \quad \text{(Equation 10)}$$

By this means, a state continues where balance parameters outputted from gain factor decoding section 210 are selected, γ becomes close to "0" as the processing in equation 10 repeats, and, when a state where balance parameters outputted from gain factor decoding section 210 are selected continues for some frames, Gm=G^. Here, it is equally possible to determine in advance the number of frames required for Gm=G^ and set Gm=G^ at the timing a state where balance parameters outputted from gain factor decoding section 210 are selected continues for that number of frames. Thus, by making a balance parameter received as input in multiplying section 221 gradually closer to the balance parameter received as input from gain factor decoding section 210, it is possible to prevent degradation in subjective quality due to a rapid change of sound image or localization.

Thus, according to the present embodiment, in a case where balance parameters included in stereo encoded data cannot be used (or are not used), balance adjustment processing is performed on a monaural signal using balance parameters calculated from the L channel signal and the R channel signal of a stereo signal obtained in the past. Therefore, according to the present embodiment, it is possible to alleviate the fluctuation of localization of decoded signals and maintain the stereo performance.

Also, the present embodiment calculates balance parameters using the amplitude ratio of the L channel signal or the R channel signal with respect to a signal adding the L channel signal and the R channel signal of a stereo signal. Therefore, according to the present embodiment, it is possible to calculate suitable balance parameters, compared to a case of using the amplitude ratio of the L channel signal or the R channel signal with respect to a monaural signal.

Also, the present embodiment applies smoothing processing on the frequency axis to the L channel signal and the R channel signal to calculate balance parameters. Therefore, according to the present embodiment, it is possible to obtain stable localization and stereo performance even in a case where the frequency unit (frequency resolution) to perform balance adjustment processing is small.

Therefore, according to the present embodiment, even in a case where balance adjustment information such as balance parameters cannot be used as parametric stereo parameters, it is possible to generate pseudo stereo signals of high quality.

VARIATION EXAMPLE

Figure 5:
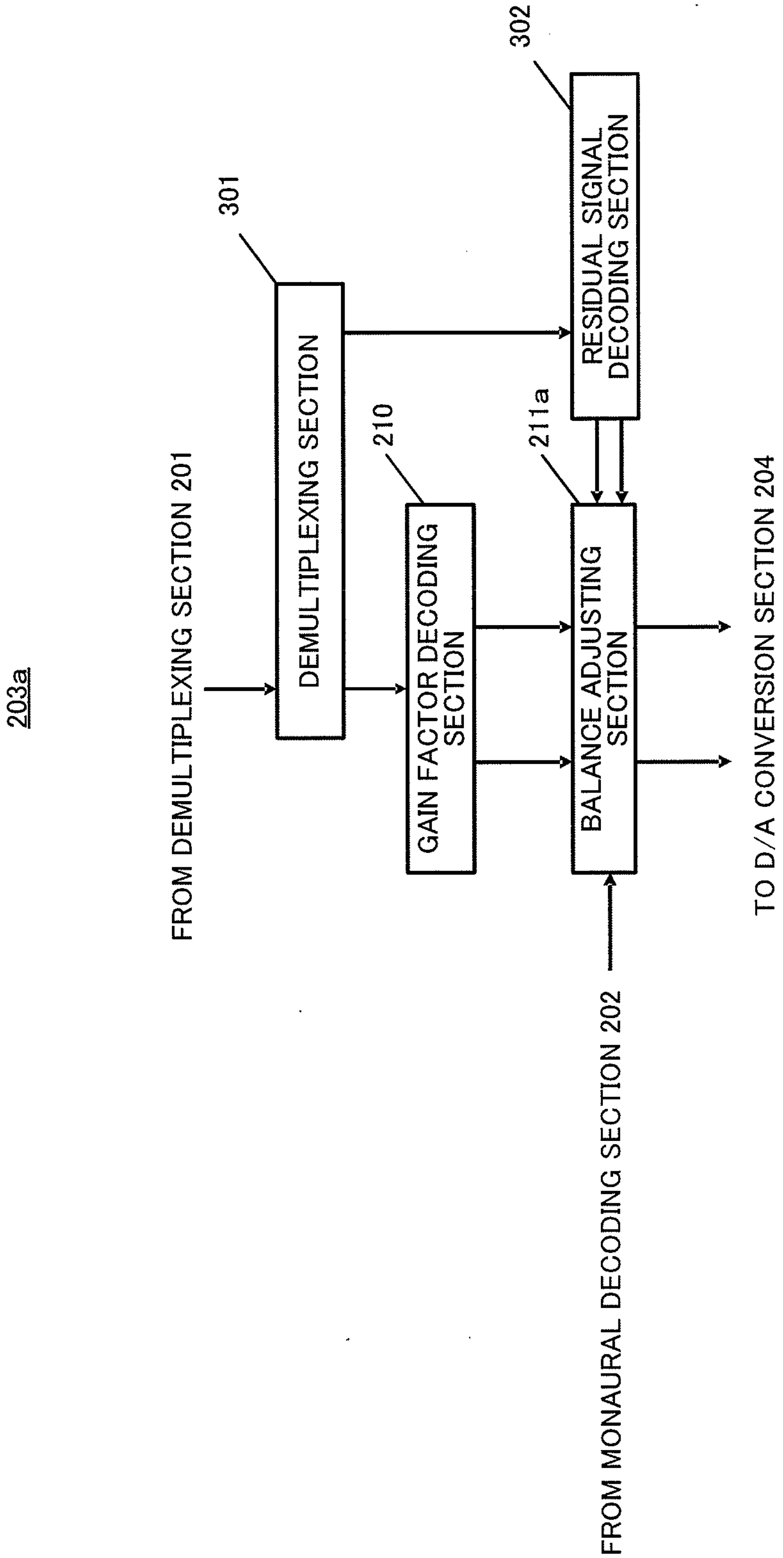
FIG. 5 is a block diagram showing a configuration example of a stereo decoding section according to Embodiment 1 of the present invention.

FIG. 5 shows a variation example of a configuration of stereo decoding section 203*a* of acoustic signal decoding apparatus 200. This variation example adopts demultiplexing section 301 and residual signal decoding section 302 in addition to the configuration in FIG. 2. In FIG. 5, blocks that perform the same operations as in FIG. 2 will be assigned the same reference numerals as in FIG. 2 and explanation of their operations will be omitted.

Demultiplexing section 301 receives as input stereo encoded data outputted from demultiplexing section 201, demultiplexes the stereo encoded data into balance parameter encoded data and residual signal encoded data, outputs the balance parameter encoded data to gain factor decoding section 210 and outputs the residual signal encoded data to residual signal decoding section 302.

Residual signal decoding section 302 receives as input the residual signal encoded data outputted from demultiplexing section 301 and outputs the decoded residual signal of each channel to balance adjusting section 211*a*.

Figure 10:
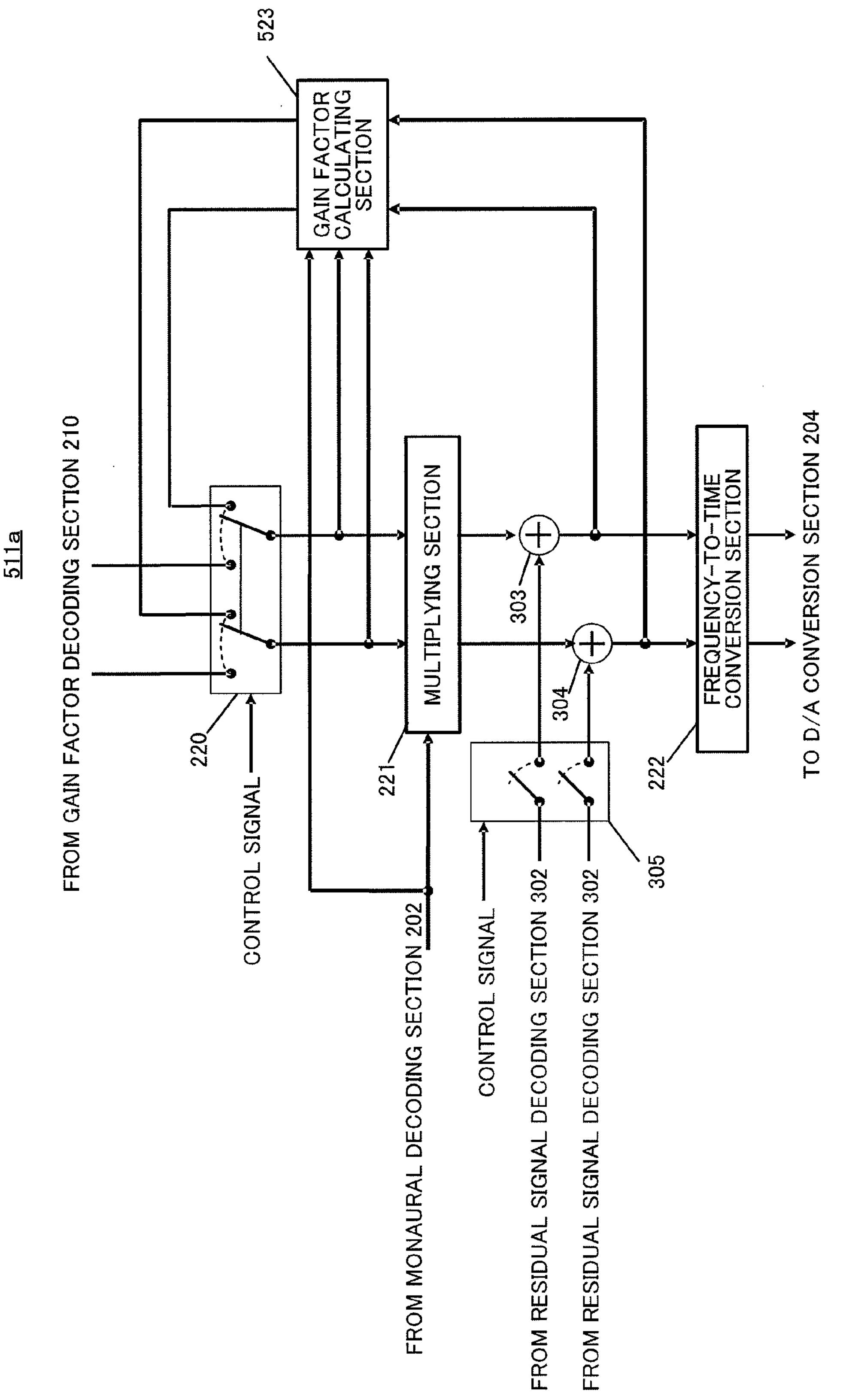
FIG. 10 is a block diagram showing a configuration example of a balance adjusting section according to Embodiment 2 of the present invention.

In this variation example, a case is explained where the present invention is applied to a configuration in which monaural-to-stereo scalable coding is performed to represent a stereo signal parametrically and encode, as a residual signal, difference components that cannot be represented parametrically (i.e. for example, the configuration shown in FIG. 10 of Patent Literature 3).

Figure 6:
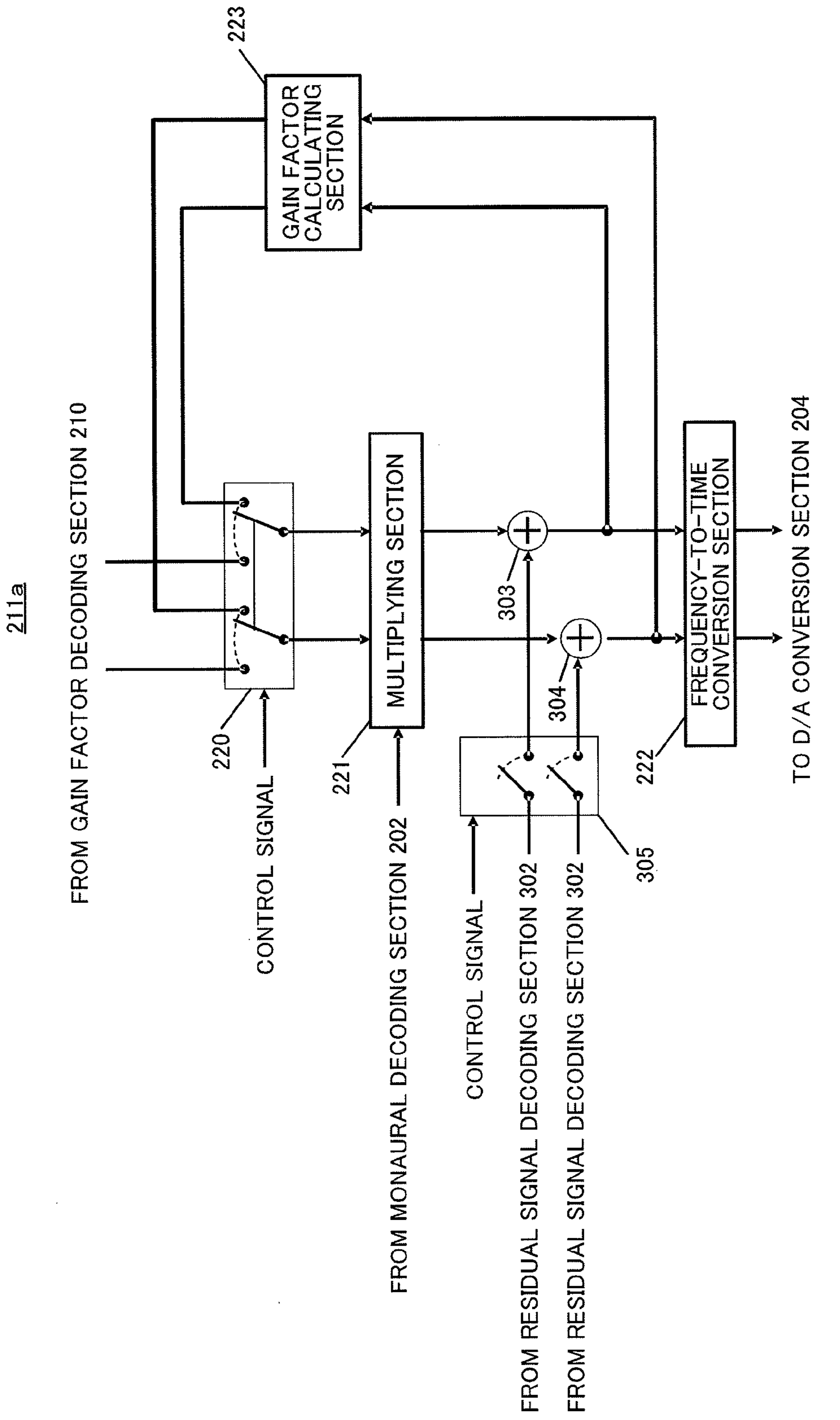
FIG. 6 is a block diagram showing a configuration example of a balance adjusting section according to Embodiment 1 of the present invention.

Next, FIG. 6 shows a configuration of balance adjusting section 211*a* in the present variation example.

As shown in FIG. 6, balance adjusting section 211*a* in the present variation example further has adding sections 303 and 304 and selecting section 305 in addition to the configuration in FIG. 3. In FIG. 6, blocks that perform the same operations as in FIG. 3 will be assigned the same reference numerals and their operational explanation will be omitted.

Adding section 303 receives as input the L channel signal outputted from multiplying section 221 and an L channel residual signal outputted from selecting section 305, performs addition processing of these signals and outputs the addition result to frequency-to-time conversion section 222 and gain factor calculating section 223.

Adding section 304 receives as input the R channel signal outputted from multiplying section 221 and an R channel residual signal outputted from selecting section 305, performs addition processing of these signals and outputs the addition result to frequency-to-time conversion section 222 and gain factor calculating section 223.

In the case of receiving a residual signal as input from residual signal decoding section 302 (i.e. in the case where a residual signal included in stereo encoded data can be used), selecting section 305 selects and outputs the residual signal to adding section 303 and adding section 304. Also, in the case of not receiving a residual signal as input from residual signal decoding section 302 (i.e. in the case where a residual signal included in stereo encoded data cannot be used), selecting section 305 outputs nothing or outputs an all-zero signal to adding section 303 and adding section 304. For example, as shown in FIG. 6, selecting section is formed with two switching switches. One switching switch is for the L channel and its output terminal is connected to adding section 303, and the other switching switch is for the R channel and its output terminal is connected to adding section 304. Here, by switching these switching switches together, the above selection is performed.

Here, as a case of not inputting a residual signal from residual signal decoding section 302 into selecting section 305, a case is assumed where stereo encoded data is lost on the transmission path and is not received in acoustic signal decoding apparatus 200, or where error is detected in stereo encoded data received in acoustic signal decoding apparatus 200 and this data is discarded. That is, a case of not receiving a residual signal as input from residual signal decoding section 302 is equivalent to a case where a residual signal included in stereo encoded data cannot be used for some reason. FIG. 6 shows a configuration of inputting a control signal indicating whether or not it is possible to use a residual signal included in stereo encoded data, in selecting section 305 and switching the connection state of the switching switches of selecting section 305 based on that control signal.

Also, for example, for the purpose of reducing the bit rate, if a residual signal included in stereo encoded data is not used, selecting section 305 may open the switching switches and output nothing, or output all-zero signals.

Frequency-to-time conversion section 222 converts the addition result outputted from adding section 303 and the addition result outputted from adding section 304 into time signals and outputs these to D/A conversion section 204 as respective digital stereo signals for the L and R channels.

Figure 7:
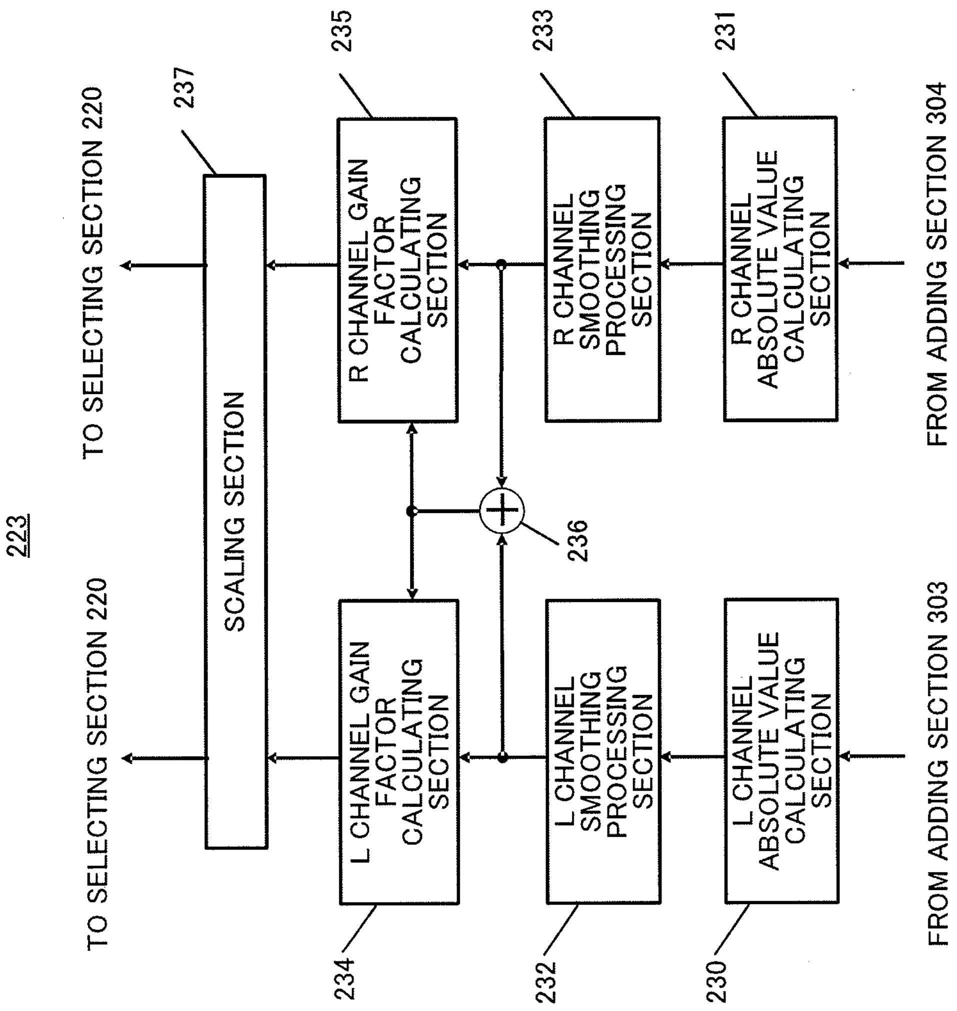
FIG. 7 is a block diagram showing a configuration example of a gain factor calculating section according to Embodiment 1 of the present invention.

The specific calculation method of balance parameters in gain factor calculating section 223 is similar to that explained with reference to FIG. 4. Here, there are only differences that an input into L channel absolute value calculating section 230 is an output result of adding section 303 and an input into R channel absolute value calculating section 231 is an output result of adding section 304. This state is illustrated in FIG. 7.

(Embodiment 2)

The acoustic signal decoding apparatus according to Embodiment 2 will be explained. The configuration of the acoustic signal decoding apparatus according to Embodiment 2 differs from the configuration of acoustic signal decoding apparatus 200 according to Embodiment 1 only in a balance adjusting section. Therefore, the configuration and operations of the balance adjusting section will be mainly explained below.

Figure 8:
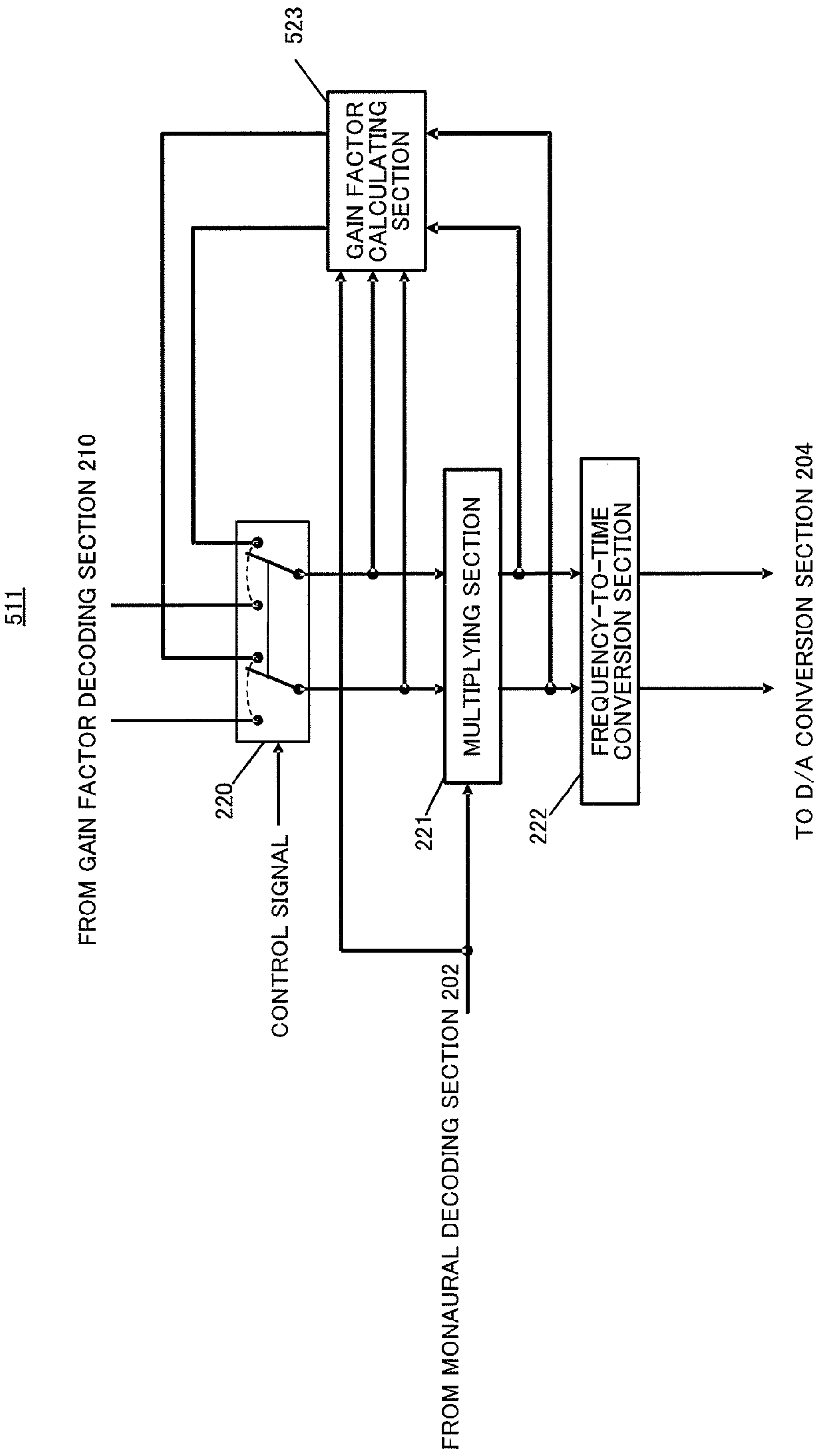
FIG. 8 is a block diagram showing a configuration example of a balance adjusting section according to Embodiment 2 of the present invention.

FIG. 8 shows a configuration of balance adjusting section 511 according to Embodiment 2. As shown in FIG. 8, balance adjusting section 511 is provided with selecting section 220, multiplying section 221, frequency-to-time conversion section 222 and gain factor calculating section 523. Selecting section 220, multiplying section 221 and frequency-to-time conversion section 222 perform the same operations as in sections of the same names forming balance adjusting section 211, and therefore their explanation will be omitted.

Gain factor calculating section 523 calculates balance parameters for compensation using a decoded monaural signal received as input from monaural decoding section 202, balance parameters for both the L and R channels received as input from selecting section 220 and multiplication results in the L and R channels received as input from multiplying section 221 (i.e. frequency domain parameters for both the L and R channels). The balance parameters for compensation are calculated for the L channel and the R channel. These balance parameters for compensation are outputted to selecting section 220.

Figure 9:
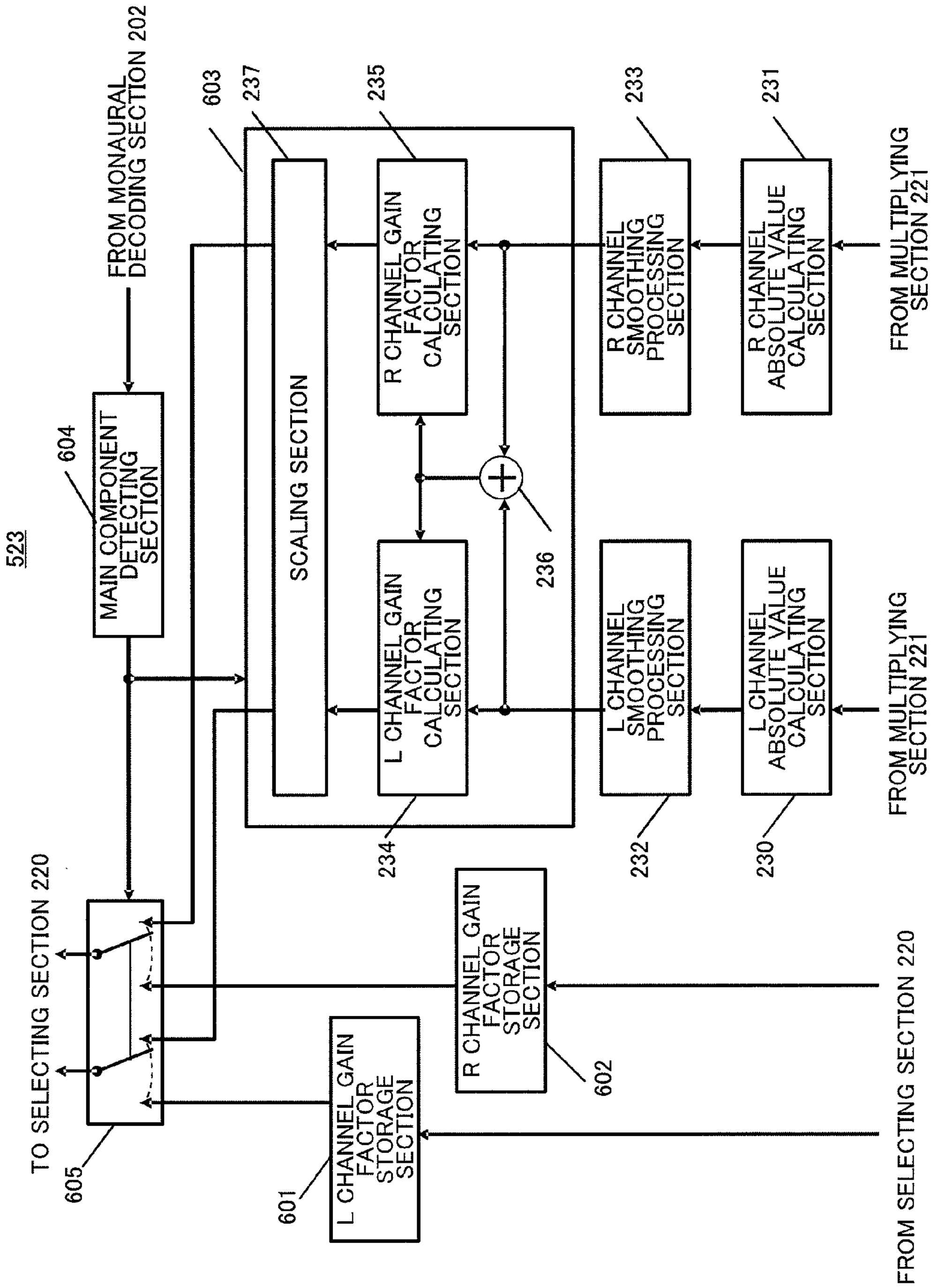
FIG. 9 is a block diagram showing a configuration example of a gain factor calculating section according to Embodiment 2 of the present invention.

Next, FIG. 9 shows a configuration of gain factor calculating section 523.

As shown in FIG. 9, gain factor calculating section 523 is provided with L channel absolute value calculating section 230, R channel absolute value calculating section 231, L channel smoothing processing section 232, R channel smoothing processing section 233, L channel gain factor storage section 601, R channel gain factor storage section 602, main component gain factor calculating section 603, main component detecting section 604 and switching switch 605. L channel absolute value calculating section 230, R channel absolute value calculating section 231, L channel smoothing processing section 232 and R channel smoothing processing section 233 perform the same operations as in the sections of the same names forming gain factor calculating section 223 explained in Embodiment 1.

Main component detecting section 604 receives a decoded monaural signal as input from monaural decoding section 202. This decoded monaural signal is a frequency domain parameter. Main component detecting section 604 detects frequency components at which the amplitude exceeds a threshold among frequency components included in the input decoded monaural signal, and outputs these detected frequency components as main component frequency information to main component gain factor calculating section 603 and switching switch 605. Here, a threshold to use for detection may be a fixed value or a certain ratio with respect to the average amplitude of the whole frequency domain parameter. Also, the number of detected frequency components outputted as main component frequency information is not limited specifically, and may be all of frequency components exceeding a threshold or may be a predetermined number.

L channel gain factor storage section 601 receives an L channel balance parameter as input from selecting section 220 and stores it. The stored L channel balance parameter is outputted to switching switch 605 in the next frame or later. Also, R channel gain factor storage section 602 receives an R channel balance parameter as input from selecting section 220 and stores it. The stored R channel balance parameter is outputted to switching switch 605 in the next frame or later.

Here, selecting section 220 selects one of a balance parameter obtained in gain factor decoding section 210 and a balance parameter outputted from gain factor calculating section 523, as a balance parameter to be used next in multiplying section 221 (e.g. a balance parameter to be used in the current frame). This selected balance parameter is received as input in L channel gain factor storage section 601 and R channel gain factor storage section 602, and stored as a balance parameter used previously in multiplying section 221 (e.g. a balance parameter used in the previous frame). Also, a balance parameter is stored every frequency.

Main component gain factor calculating section 603 is formed with L channel gain factor calculating section 234, R channel gain factor calculating section 235, adding section 236 and scaling section 237. The sections forming main component gain factor calculating section 603 perform the same operations as in the sections of the same names forming gain factor calculating section 223.

Here, based on main component frequency information received as input from main component detecting section 604 and frequency domain parameters subjected to smoothing processing received from L channel smoothing processing section 232 and R channel smoothing processing section 233, main component gain factor calculating section 603 calculates balance parameters only for frequency components given as the main component frequency information.

That is, when main component frequency information received as input from main component detecting section 604 is j, for example, GL[j] and GR[j] are calculated according to above equations 1 and 2. Here, the condition of $j \in i$ is satisfied. Also, for ease of explanation, smoothing processing is not considered.

Thus, the calculated balance parameters for the main frequency are outputted to switching switch 605.

Switching switch 605 receives balance parameter as input from main component gain factor calculating section 603, L channel gain factor storage section 601 and R channel gain factor storage section 602, respectively. Based on the main component frequency information received as input from main component detecting section 604, switching switch 605 selects the balance parameters received from main component gain factor calculating section 603 or the balance parameters received from L channel gain factor storage section 601 and R channel gain factor storage section 602, every frequency component, and outputs the selected balance parameters to selecting section 220.

To be more specific, when main component frequency information is j, switching switch 605 selects balance parameters GL[j] and GR[j] received as input from main component gain factor calculating section 603 in frequency component j, and selects balance parameters received as input from L channel gain factor storage section 601 and R channel gain factor storage section 602 in other frequency components.

As described above, according to the present embodiment, in gain factor calculating section 523, main component gain factor calculating section 603 calculates balance parameters only for main frequency components, and switching switch 605 selectively outputs the balance parameters obtained in main component gain factor calculating section 603 as balance parameters for the main frequency components while selectively outputting balance parameters stored in L channel gain factor storage section 601 and R channel gain factor storage section 602 as balance parameters for frequency components other than the main frequency components.

By this means, balance parameters are calculated only in frequency components of high amplitude and past balance parameters are used in other frequency components, so that it is possible to generate pseudo stereo signals of high quality with a small amount of processing.

Variation Example 1

FIG. 10 shows a configuration of balance adjusting section 511*a* according to a variation example of Embodiment 2. The present variation example provides adding sections 303 and 304 and selecting section 305 in addition to the configuration in FIG. 8. Operations of the components added to FIG. 8 are the same as in FIG. 6, and therefore the components will be assigned the same reference numerals and their operational explanation will be omitted.

Figure 11:
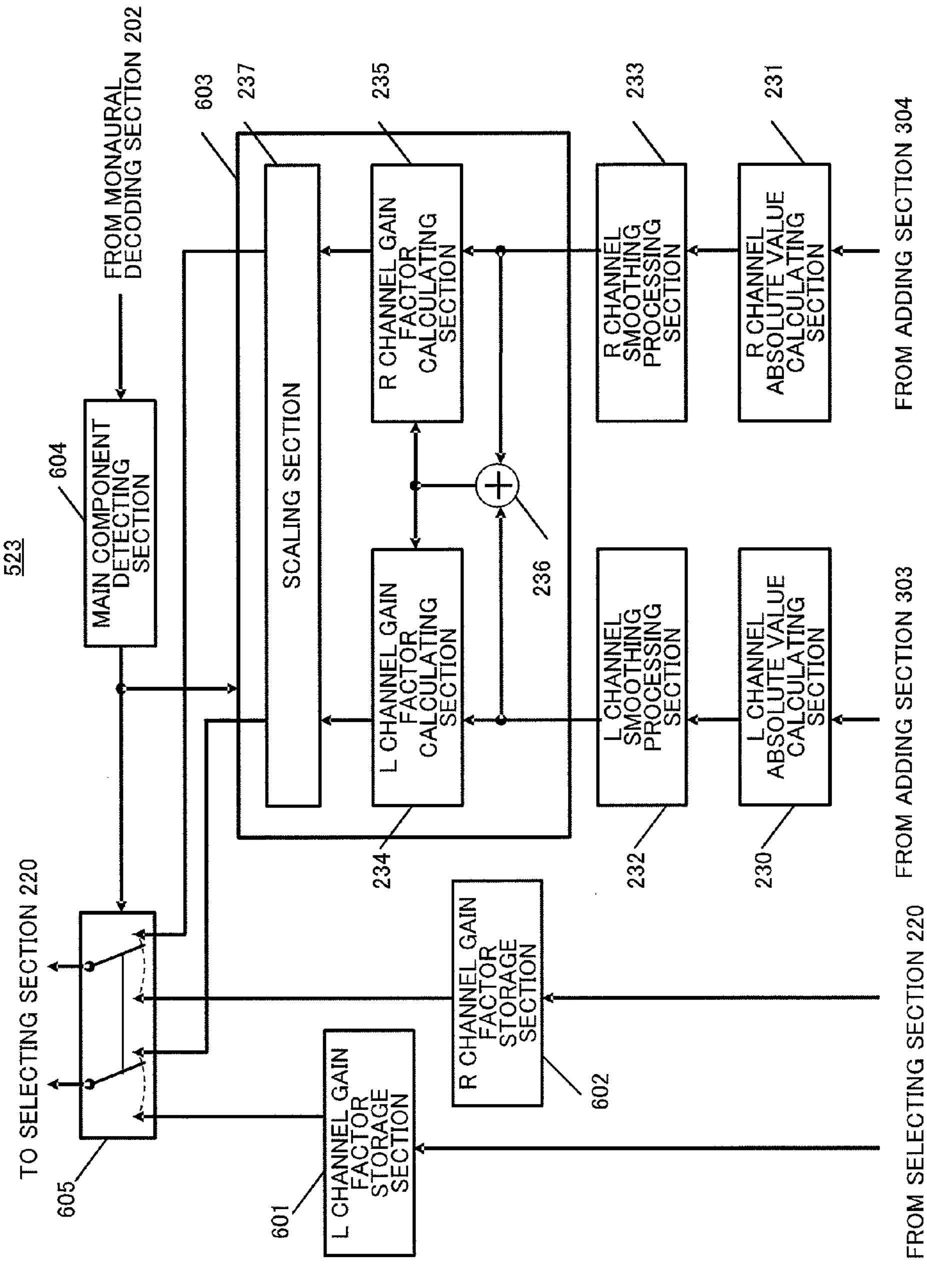
FIG. 11 is a block diagram showing a configuration example of a gain factor calculating section according to Embodiment 2 of the present invention.

FIG. 11 shows a configuration of gain factor calculating section 523 according to the present variation example. The configuration and operations are the same as in FIG. 9 and therefore will be assigned the same reference numerals and their explanation will be omitted. There are only differences that an input into L channel absolute value calculating section 230 is an output of adding section 303 and an input into R channel absolute value calculating section 231 is an output of adding section 304.

Variation Example 2

In a case where smoothing processing performed in L channel smoothing processing section 232 and R channel smoothing processing section 233 refers to smoothing processing performed using only frequency components near the main component frequency as shown in equations 3 and 5, individual processing performed in L channel absolute value calculating section 230, R channel absolute value calculating section 231, L channel smoothing processing section 232 and R channel smoothing processing section 233 needs not be performed in all frequency components and needs to be performed only for essential frequency components. By this means, it is possible to further reduce the amount of processing in gain factor calculating section 523. To be more specific, when main component frequency information is j, L channel absolute value calculating section 230 and R channel absolute value calculating section 231 are operated for frequency components j−1, j and j+1. Using this result, L channel smoothing processing section 232 and R channel smoothing processing section 233 need to calculate frequency domain parameters smoothed only for frequency component j.

Figure 12:
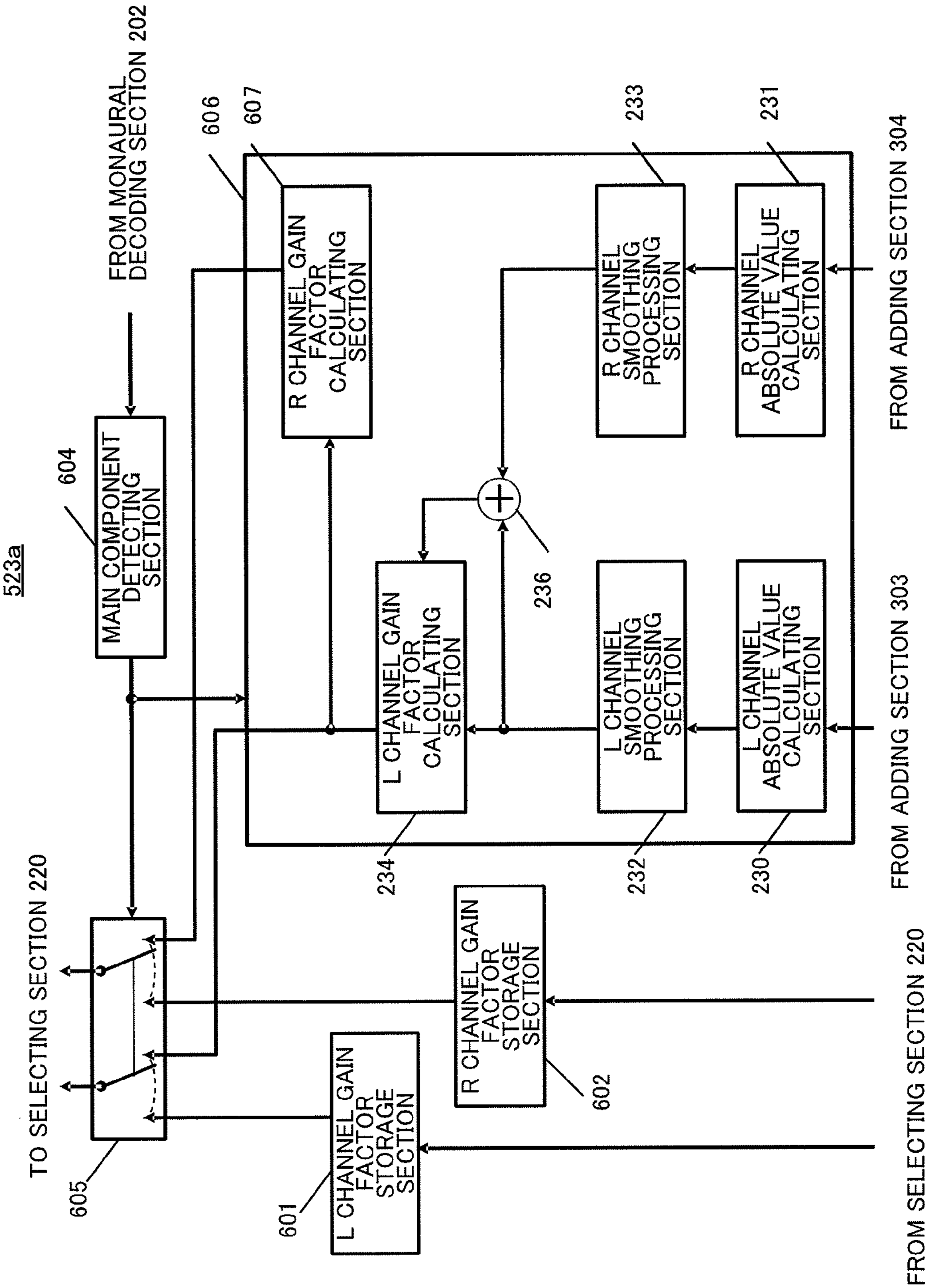
FIG. 12 is a block diagram showing a configuration example of a gain factor calculating section according to Embodiment 2 of the present invention.

FIG. 12 shows a configuration of gain factor calculating section 523*a* according to the present variation example. Here, FIG. 12 shows the configuration of calculating right channel gain factor GR(f) from GR(f)=2.0−GL(f), described in Embodiment 1. The same components and operations as in FIG. 11 will be assigned the same reference numerals and their explanation will be omitted. FIG. 12 differs from FIG. 11 mainly in the configuration inside a main component gain factor calculating section.

Main component gain factor calculating section 606 is provided with L channel absolute value calculating section 230, R channel absolute value calculating section 231, L channel smoothing processing section 232, R channel smoothing processing section 233, L channel gain factor calculating section 234, R channel gain factor calculating section 607 and adding section 236.

Main component gain factor calculating section 606 calculates balance parameters only for main component frequency information j received as input from main component detecting section 604. Here, an example case will be explained where smoothing processing in L channel smoothing processing section 232 and R channel smoothing processing section adopts smoothing of three points shown in above equations 3 and 5. Therefore, in the present variation example, main component gain factor calculating section 606 employs a configuration including L channel absolute value calculating section 230, R channel absolute value calculating section 231, L channel smoothing processing section 232 and R channel smoothing processing section 233.

L channel absolute value calculating section 230 and R channel absolute value calculating section 231 performs absolute value processing only for frequency components j−1, j and j+1.

L channel smoothing processing section 232 and R channel smoothing processing section 233 receive as input the absolute values of frequency components in each channel for j−1, j and j+1, calculate smoothing values for frequency component j and output the smoothing values to adding section 236.

The output of L channel smoothing processing section 232 is also received as input in L channel gain factor calculating section 234.

As in FIG. 11, L channel gain factor calculating section 234 calculates a left channel balance parameter for frequency component j. The calculated L channel balance parameter is outputted to switching switch 605 and R channel gain factor calculating section 607.

R channel gain factor calculating section 607 receives the L channel balance parameter as input and then calculates GR(f) from the relationship of GR(f)=2.0−GL(f). The balance parameters calculated as above satisfy GL(f)+GR(f)=2.0, so that scaling processing in scaling section 237 is not necessary. The calculated R channel balance parameter is outputted to switching switch 605.

By employing this configuration, absolute value processing, smoothing processing and balance parameter calculations are performed only for the main components, so that it is possible to calculate balance parameters with a smaller amount of processing.

Also, in a case where the configuration of gain factor calculating section 523*a* is applied to gain factor calculating section 523 in FIG. 8, an input into L channel absolute value calculating section 230 and R channel absolute value calculating section 231 is an output of multiplying section 221.

Also, in the configurations of gain factor calculating sections 523 in FIG. 9 and FIG. 11, main component gain factor calculating section 603 perform processing only for the main component frequency. However, even in gain factor calculating sections 523 in FIG. 9 and FIG. 11, similar to gain factor calculating section 523*a* in FIG. 12, a case is possible where a main component gain factor calculating section employs a configuration including L channel absolute value calculating section 230, R channel absolute value calculating section 231, L channel smoothing processing section 232 and R channel smoothing processing section 233, and where processing in L channel absolute value calculating section 230, R channel absolute value calculating section 231, L channel smoothing processing section 232 and R channel smoothing processing section 233 is performed for the main component frequency.

Embodiments and their variation examples have been explained above.

Also, an acoustic signal used for explanation of the present invention is used as a collective term of an audio signal, a speech signal, and so on. The present invention is applicable to any of these signals or a case where there are these signals in a mixed manner.

Also, although cases have been described above with embodiments and their variation examples where the left channel signal is L and the right channel signal is R, conditions related to positions are not specified by description of L and R.

Also, although a configuration of two channels of L and R has been described as an example with embodiments and their variation examples, even in frame erasure concealment processing in a multi-channel coding scheme for defining an average signal of a plurality of channels as a monaural signal and expressing the signal of each channel by multiplying the monaural signal by the weight coefficient for each channel signal as a balance parameter, the present invention is applicable. In this case, in line with equations 1 and 2, for example, in a case of three channels, it is possible to define balance parameters as follows. Here, C represents the third channel signal, GC represents the third channel balance parameter.

$$GL[i]=|L[i]|/(|L[i]|+|R[i]|+|C[i]|) \quad \text{(Equation 11)}$$

$$GR[i]=|R[i]|/(|L[i]|+|R[i]|+|C[i]|) \quad \text{(Equation 12)}$$

$$GC[i]=|C[i]|/(|L[i]|+|R[i]|+|C[i]|) \quad \text{(Equation 13)}$$

Also, although example cases have been described above where the acoustic signal decoding apparatus according to embodiments and their variation example receives and processes multiplexed data (bit streams) transmitted from the acoustic signal encoding apparatus according to the present embodiments, the present invention is not limited to this, and an essential requirement is that bit streams received and processed by the acoustic signal decoding apparatus according to embodiments need to be transmitted from an acoustic signal encoding apparatus that can generate bit streams which can be processed by that acoustic signal decoding apparatus.

Also, the acoustic signal decoding apparatus according to the present invention is not limited to the above embodiments and their variation example, and can be implemented with various changes.

Also, the acoustic signal decoding apparatus according to the present invention can be mounted on a communication terminal apparatus and base station apparatus in a mobile communication system, so that it is possible to provide a communication terminal apparatus, base station apparatus and mobile communication system having the same operational effects as above.

Although example cases have been described above with embodiments and their variation example where the present invention is implemented with hardware, the present invention can be implemented with software. For example, by describing an algorithm of the acoustic signal decoding method according to the present invention in a programming language, storing this program in a memory and running this program by an information processing section, it is possible to implement the same function as the acoustic signal encoding apparatus of the present invention.

Furthermore, each function block employed in the description of each of the aforementioned embodiments may typically be implemented as an LSI constituted by an integrated circuit. These may be individual chips or partially or totally contained on a single chip.

"LSI" is adopted here but this may also be referred to as "IC," "system LSI," "super LSI," or "ultra LSI" depending on differing extents of integration.

Further, the method of circuit integration is not limited to LSI's, and implementation using dedicated circuitry or general purpose processors is also possible. After LSI manufacture, utilization of an FPGA (Field Programmable Gate Array) or a reconfigurable processor where connections and settings of circuit cells in an LSI can be regenerated is also possible.

Further, if integrated circuit technology comes out to replace LSI's as a result of the advancement of semiconductor technology or a derivative other technology, it is naturally also possible to carry out function block integration using this technology. Application of biotechnology is also possible.

The disclosures of Japanese Patent Application No. 2008-168180, filed on Jun. 27, 2008, and Japanese Patent Application No. 2008-295814, filed on Nov. 19, 2008, including the specifications, drawings and abstracts, are incorporated herein by reference in their entireties.

Industrial Applicability

The acoustic signal decoding apparatus according to the present invention has a limited amount of memory that can be used, and is especially useful for a communication terminal apparatus such as a mobile telephone that is forced to perform radio communication at low speed.

The invention claimed is:

1. An acoustic signal decoding apparatus, comprising:

a decoder that decodes a first balance parameter from stereo encoded data;

a calculator that calculates a second balance parameter using a first channel signal and a second channel signal of a stereo signal obtained in a past; and a balance adjuster that performs balance adjustment processing of a monaural signal using the second balance parameter as a balance adjustment parameter when the first balance parameter cannot be used, wherein the calculator calculates the second balance parameter, using an amplitude ratio of the first channel signal with respect to a signal adding the first channel signal and the second channel and an amplitude ratio of the second channel signal with respect to the added signal.

2. The acoustic signal decoding apparatus according to claim 1, further comprising:

a storage that stores a balance parameter used in a past in the balance adjuster ; and a detector that detects a frequency component which is included in the monaural signal and which has an amplitude value equal to or greater than an amplitude threshold, wherein:

the calculator calculates the second balance parameter only for the detected frequency component; and the balance adjuster uses, as the balance adjustment parameter, the balance parameter stored in the storage instead of the second balance parameter, for other components than the detected frequency component.

3. The acoustic signal decoding apparatus according to claim 1, further comprising:

a smoothing processor that performs smoothing processing of the first channel signal and the second channel signal on a frequency axis, wherein the second balance parameter is calculated using the first channel signal and the second channel signal after smoothing processing.

4. The acoustic signal decoding apparatus according to claim 2, further comprising:

a smoothing processor that performs smoothing processing of the first channel signal and the second channel signal on a frequency axis, wherein the second balance parameter is calculated using the first channel signal and the second channel signal after smoothing processing.

5. A balance adjusting method, comprising:

decoding a first balance parameter from stereo encoded data;

calculating a second balance parameter using a first channel signal and a second channel signal of a stereo signal obtained in a past; and performing balance adjustment processing of a monaural signal using the second balance parameter as a balance adjustment parameter when the first balance parameter cannot be used, wherein calculating the second balance parameter is calculated by using an amplitude ratio of the first channel signal with respect to a signal adding the first channel signal and the second channel and an amplitude ratio of the second channel signal with respect to the added signal.

6. The balance adjusting method according to claim 5, further comprising:

storing a balance parameter used in a past in a memory when performing the balance adjustment processing; and detecting a frequency component which is included in the monaural signal and which has an amplitude value equal to or greater than an amplitude threshold, wherein:

calculating the second balance parameter is calculated only for the detected frequency component; and performing the balance adjustment processing uses, as the balance adjustment parameter, the balance parameter stored in the memory instead of the second balance parameter, for other components than the detected frequency component.

* * * * *